United States Patent
Lin et al.

(10) Patent No.: US 6,766,213 B2
(45) Date of Patent: Jul. 20, 2004

(54) SEMICONDUCTOR AUTOMATION SYSTEM FOR A DAILY CHECK AND METHOD THEREOF

(75) Inventors: Chun-Nan Lin, Hsin-Chu (TW); Ming-Yu Liu, Chang-Hua Hsien (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/249,586

(22) Filed: Apr. 22, 2003

(65) Prior Publication Data

US 2004/0122548 A1 Jun. 24, 2004

(30) Foreign Application Priority Data

Dec. 24, 2002 (TW) ..................................... 091137225 A (51) Int. Cl.⁷ .............................................. G06F 19/00
(52) U.S. Cl. .............. 700/121; 700/109; 257/E21.521; 438/14
(58) Field of Search .......................... 700/90, 95, 109, 700/121; 257/E21.521, E21.525; 438/14; 714/38; 702/182–184

(56) References Cited

U.S. PATENT DOCUMENTS

| | | | | |
|---|---|---|---|---|
| 5,375,229 A | * | 12/1994 | Liccese et al. ................. | 714/49 |
| 5,754,451 A | * | 5/1998 | Williams ...................... | 702/185 |
| 5,787,021 A | * | 7/1998 | Samaha ........................ | 702/84 |
| 5,872,970 A | * | 2/1999 | Pickett et al. ................ | 709/101 |
| 6,314,379 B1 | * | 11/2001 | Hu et al. ...................... | 702/81 |
| 6,438,440 B1 | * | 8/2002 | Hayashi ...................... | 700/121 |
| 6,466,945 B1 | * | 10/2002 | Goh et al. .................... | 707/102 |
| 6,556,881 B1 | * | 4/2003 | Miller ......................... | 700/108 |
| 2003/0109945 A1 | | 6/2003 | Cho et al. | |

* cited by examiner

Primary Examiner—Jayprakash N. Gandhi
(74) Attorney, Agent, or Firm—Winston Hsu (57) ABSTRACT

A semiconductor automation system for a daily check is provided. The semiconductor automation system includes a database for storing testing items, testing specifications, and testing frequencies for each semiconductor equipment; a processor for selecting a corresponding testing specification from the database to perform real time calculation on newly added testing data, thus getting a testing result; and a message server for alarming engineers associated with the daily check when the testing result is abnormal.

22 Claims, 13 Drawing Sheets

SEMICONDUCTOR AUTOMATION SYSTEM FOR A DAILY CHECK AND METHOD THEREOF

BACKGROUND OF INVENTION

1. Field of the Invention

The present invention relates to a management system for semiconductor equipment testings and a method thereof, so as to prevent abnormal testing results made by human errors.

2. Description of the Prior Art

With developments of the industrial society, various types of manufacturing equipments are developed to raise production yields. For example, various types of manufacturing equipments are required to define patterns of semiconductor electric devices in different processes, such as thin-film deposition equipments, photolithographic equipments, etching equipments, ion implantation equipments, rapid thermal treatment equipments, and chemicalmechanical polishing equipments. To ensure the characteristics of the devices agree with the specifications thereof, a high degree of cleanness is required in the manufacturing environment and a high reliability is also required on the manufacturing equipments. Therefore, either new or used equipments have to do equipment tests according to a predetermined testing frequency to check whether a specific testing item of the equipments agrees with corresponding specifications, so as to expand a life-span of the equipments and ensure the quality of the products.

Figure 1:
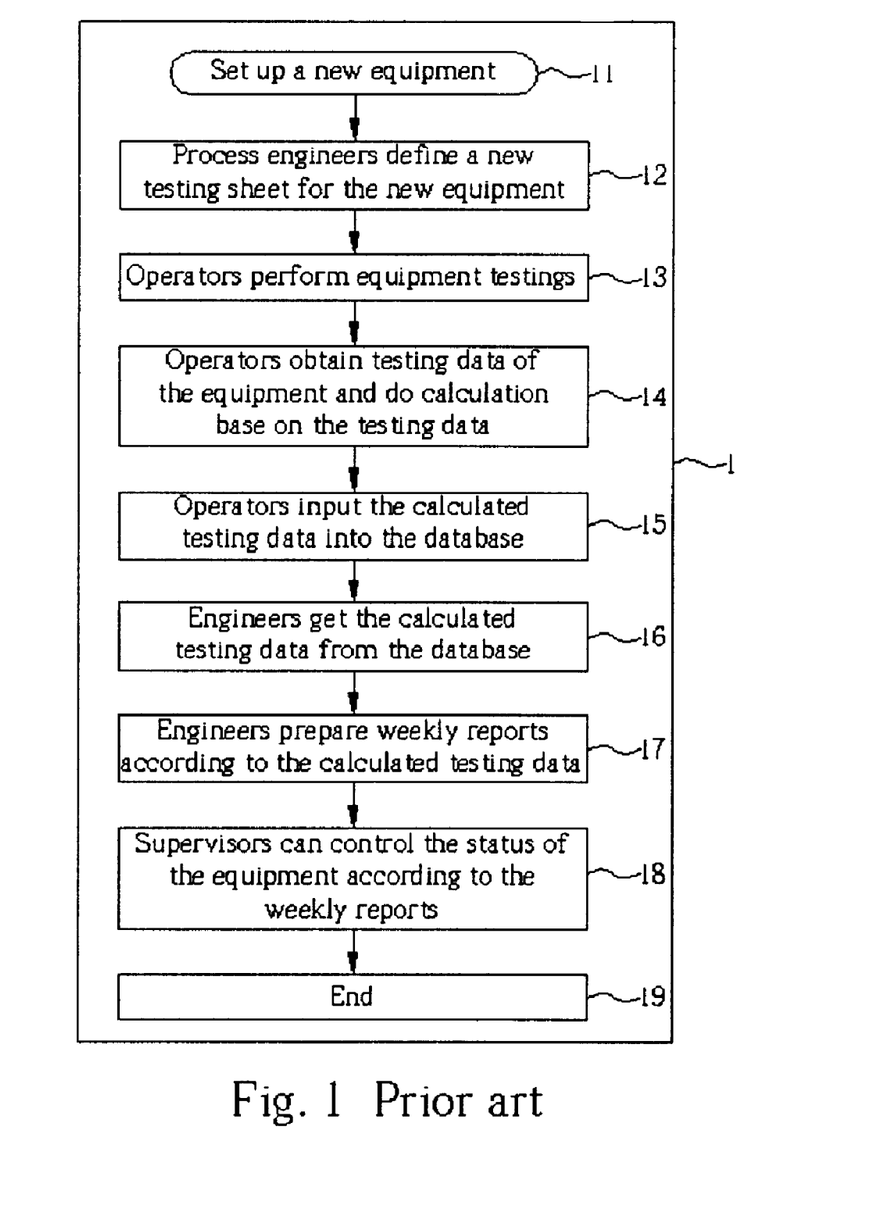
FIG. 1 is a flow chart for semiconductor equipment testings according to the prior art.

Please refer to FIG. 1 of a flow chart for semiconductor equipment tests according to the prior art. As shown in FIG. 1, a flow chart 1 for the semiconductor equipment tests according to the prior art includes the following steps:

step 11: set up a new equipment, for example build operating conditions or parameters for the equipment;

step 12: process engineers define a new testing sheet for the new equipment, the testing sheet including testing items and testing specifications for the new equipment;

step 13: operators perform equipment testings, for example put monitor wafers in the equipment to perform associated processes;

step 14: operators obtain testing data of the equipment and do calculation base on the testing data;

step 15: operators input the calculated testing data in a database;

step 16: engineers get the calculated testing data from the database;

step 17: engineers prepare weekly reports according to the calculated testing data, for example use the Excel tools to illustrate the calculated testing data into trend charts;

step 18: supervisors can control the status of the equipment according to the weekly reports; and step 19: end.

The prior art for equipment testings has several disadvantages. For example, the process engineers have to define the new testing sheet for each of the new equipment, the operators have to do calculation base on the testing data before the testing data is stored in the database, the engineers have to prepare the reports every week, and the supervisors can control the status of the equipments only depending on the weekly reports. Therefore, the prior method increases the load of the engineers. In addition, the reliability of the testing data is reduced since it is possible for the operators to use wrong testing sheets or make calculation errors on the testing data. Furthermore, since the supervisors cannot get real time testing results for the equipment, it is hard for them to effectively control the equipments.

SUMMARY OF INVENTION

It is therefore an objective of the claimed invention to provide an automation system for semiconductor equipment testings to prevent abnormal testing results made by human errors.

It is another objective of the claimed invention to provide an automation system for semiconductor equipment testings to improve reliability of equipment testings.

It is another objective of the claimed invention to provide an automation system for semiconductor equipment testings to provide real time information of equipment testings and event management.

According to the claimed invention, the semiconductor automation system includes a database for storing testing items, testing specifications, and testing frequencies for each semiconductor equipment; a processor for selecting a corresponding testing specification from the database to perform real time calculation on newly added testing data, thus getting a testing result; and a message server for alarming responsible engineers when the testing result is abnormal.

It is an advantage of the present invention that the semiconductor automation system utilizes the testing specifications and the calculation rules stored in the database to perform the real time calculation and check the testing result. Therefore, the equipment testings are performed more effectively, and human calculation errors are reduced to improve reliability of the equipment testings. In addition, the semiconductor automation system provides event management to send the reminder messages when the testing result is abnormal or when the equipment is found not test according to schedule. As a result, the status of the equipment can be easily controlled to facilitate analysis and improvement of production yields.

These and other objectives of the claimed invention will no doubt become obvious to those of ordinary skill in the art after reading the following detailed description of the preferred embodiment that is illustrated in the various figures and drawings.

DETAILED DESCRIPTION

Figure 2:
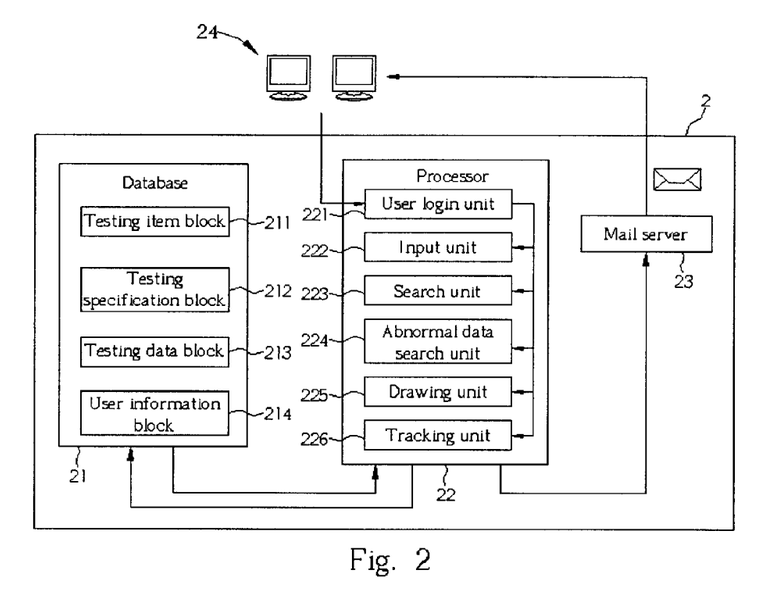
FIG. 2 is a function block diagram of a semiconductor automation system for semiconductor equipment testings according to the present invention.

Please refer to FIG. 2 of a function block diagram of a semiconductor automation system 2 for semiconductor equipment testings according to the present invention. The semiconductor automation system 2 can be used to deal with the testing data of all known semiconductor process equipments, such as etching equipments, photolithographic equipments, ion implantation equipments and thin-film equipments. As shown in FIG. 2, the semiconductor automation system 2 includes a database 21, a processor 22 and a message server 23. The database 21 functions for storing testing items, testing specifications, and testing frequencies of the semiconductor equipments. The processor 22 functions for selecting a corresponding testing specification from the database 21 to perform real time calculation on newly added testing data, thus getting a testing result. The message server 23 functions for alarming responsible persons when the testing result is abnormal. In addition, the semiconductor automation system 2 is a network management system and enables a user 24 to access the network management system and receive reminder messages from the message server 23 through Internet or other networks.

The database 21 includes a testing item block 211, a testing specification block 212, a testing data block 213 and a user information block 214. The testing item block 211 stores testing items for each of the semiconductor equipments. The testing items are defined and updated by the system developers or the process engineers with specific access permission. The testing specification block 212 stores testing specifications, effective dates of the testing specifications and testing frequencies for each of the testing items. Process engineers are allowed to define and update the data in the testing specification block 212 depending on product demands or technique levels. The testing data block 213 stores testing data for each of the semiconductor equipments. The user information block 214 stores user names, passwords and corresponding authority of the users 24.

The processor 22 includes a user login unit 221, an input unit 222, a search unit 223, an abnormal data search unit 224, a drawing unit 225 and a tracking unit 226. The user login unit 221 obtains a user name and a password from the user 24 and gets the user authority stored in the user information block 214 to determine access priority for the user 24 to use the other units of the processor 22 or access the database 21.

The input unit 222 provides equipment operators to input testing data of the equipments and store the testing data in the testing data block 213. Following that, the processor 22 searches the testing specification block 212 to select a corresponding testing specification and calculation rules of the equipment testings, and thereby performs real time calculation on the testing data stored in the testing data block 213 to generate a testing result. In addition, the user 24 may also use the input unit 222 to add/delete/update data in each block of the database 21 according to his access priority or permission.

The search unit 223 provides the user 24 to set query conditions and obtain the testing data associated with the query conditions. The abnormal data search unit 224 provides the user 24 to set query conditions and obtain the abnormal testing data associated with the query conditions. The drawing unit 225 provides the user 24 to set query conditions, obtain the testing data associated with the query conditions and generate a trend chart to illustrate the testing data. The tracking unit 226 functions for periodically tracking the testing data block 213, checking whether the testing data block 213 has the corresponding testing data to the testing frequencies of the equipments. When no corresponding testing data to the testing frequencies is found in the database 21, the system uses the message server 23 to send reminder messages to responsible persons.

Figure 3:
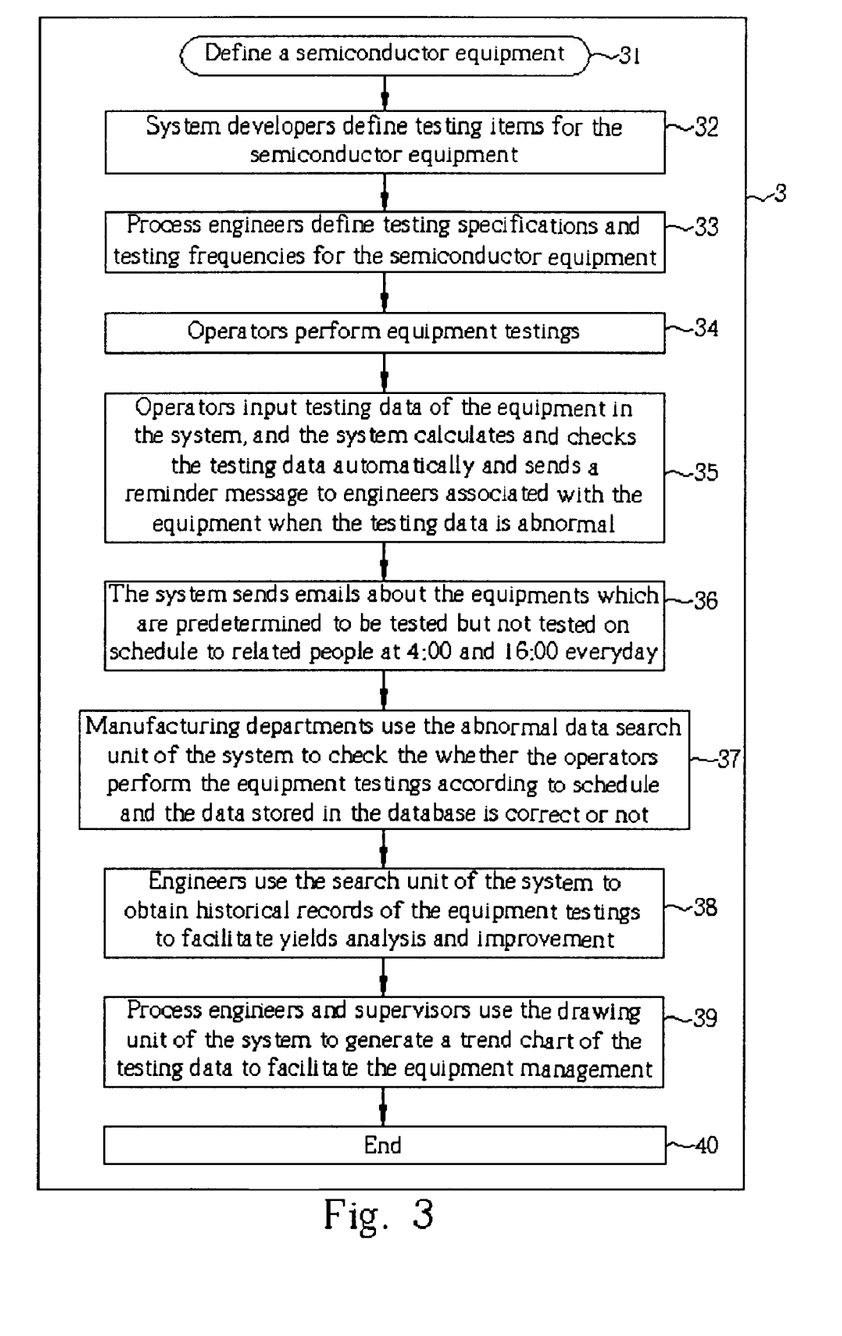
FIG. 3 is a flow chart for semiconductor equipment testings according to the present invention.

Please refer to FIG. 3 of a flow chart for a method of managing semiconductor equipment tests according to the present invention.As shown in FIG. 3, a flow chart 3 for the semiconductor equipment testings according to the present invention includes the following steps:

step 31: define a semiconductor equipment in a database, for example build operating conditions or parameters for new equipment, or confirm operating conditions or parameters for the existed equipment;

step 32: system developers define testing items for the semiconductor equipment in the database;

step 33: process engineers define testing specifications and testing frequencies associated with the testing items in the database;

step 34: operators perform equipment testings, for example put monitor wafers in the equipment to perform associated processes;

step 35: operators input testing data of the equipment in the database, and the system selects corresponding testing specifications and calculation rules to calculate and check the testing data automatically; when the testing data is abnormal, the system sends reminder messages to engineers associated with the equipment;

step 36: the system sends emails about the equipments which are predetermined to be tested but not tested on schedule to related peopleat 4:00 and 16:00 everyday;

step 37: manufacturing departments use the abnormal data search unit of the system to check whether the operators perform the equipment testings according to schedule and the data stored in the database is correct or not;

step 38: engineers use the search unit of the system to obtain historical records of the equipment testings to facilitate analysis and improvement of the production yields;

step 39: process engineers and supervisors use a drawing unit of the system to generate the trend chart of the testing data to facilitate the equipment management; and step 40: end.

Figure 4:
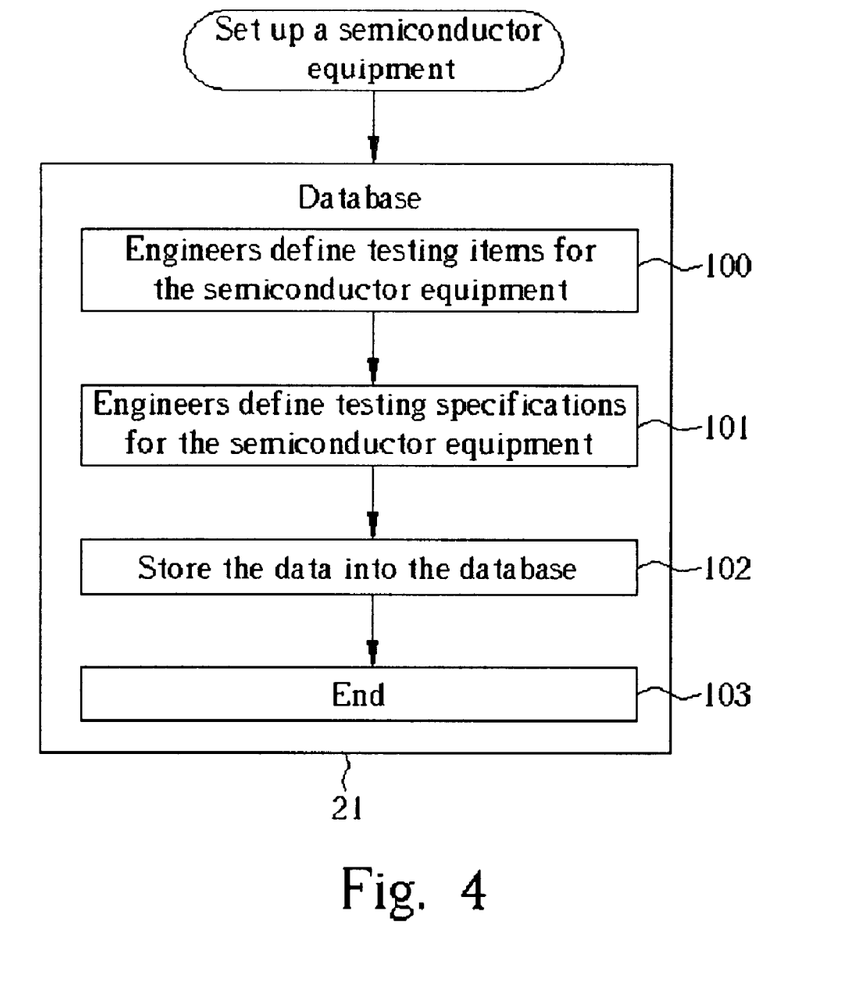
FIG. 4 is a flow chart for a first embodiment of a semiconductor automation system to define a semiconductor equipment according to the present invention.

Please refer to FIG. 4 to FIG. 13 of flow charts for further introductions to the semiconductor automation system and the method thereof according to the present invention. As shown in FIG. 4, when the user 24 uses the automation system 2 to set up the semiconductor equipment, he has to verify his access permission using the user login unit 221 of the processor 22. Following that, the user 24 uses the input unit 222 to define the equipment information in the database 21. The method to set up the equipment includes the following steps:

step 100: engineers define testing items for the semiconductor equipment in the testing item 211, for example define etching rates for etching equipment;

step 101: engineers define testing specifications, effective dates of the testing specifications and testing frequencies corresponding to the testing items defined in the step 100 in the testing specification block 212;

step 102: store the data into the database; and step 103: end.

Figure 5:
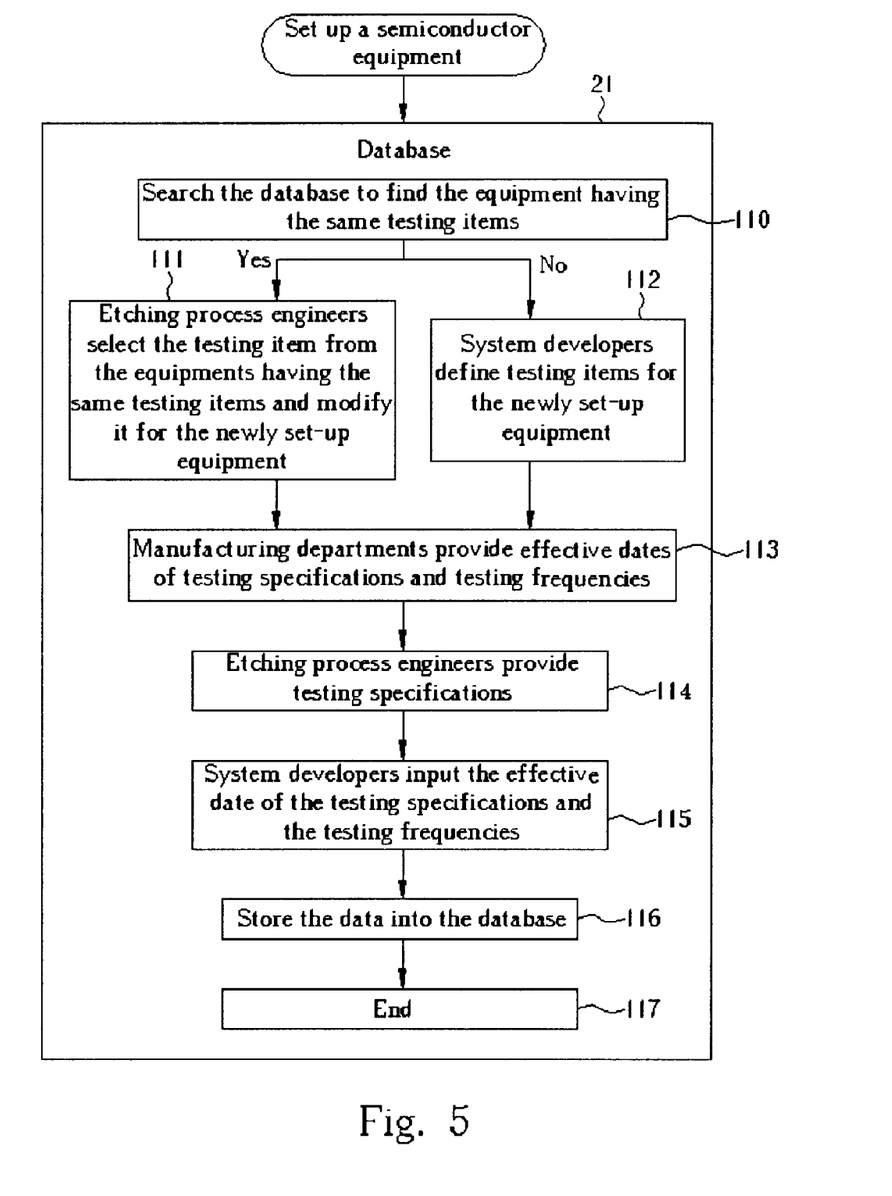
FIG. 5 is a flow chart for a second embodiment of a semiconductor automation system to define a semiconductor equipment according to the present invention.

In order to improve effects of the automation system, FIG. 5 shows a flow chart of an alternative embodiment for the automation system 2 to set up the semiconductor equipment. Before starting to set up the semiconductor equipment, the automation system 2 of this embodiment determines the semiconductor equipment to be set up is a new semiconductor equipment with or without the testing items the same as any of the existed equipments, or the semiconductor equipment to be set up is an existed equipment for performing regular equipment testings such as daily checks. After the determination of the semiconductor equipment types, the steps for defining the equipment, such as the steps for defining the testing items, the testing specifications or the testing frequencies may be appropriately simplified. This embodiment uses etching equipment as an example, however, the flow chart shown in FIG. 5 is not limited to certain semiconductor equipment. As shown in FIG. 5, the method for the user 24 to define the equipment information in the database 21 includes the following steps:

step 110: search the database to find the equipment having the same testing items; if the equipment having the same testing items is found in the database, perform the step 111; if the equipment having the same testing items is not found in the database, perform the step 112;

step 111: etching process engineers select the testing item from the equipments having the same testing items and modify it for the newly set-up equipment;

step 112: system developers define testing items for the newly set-up equipment;

step 113: manufacturing departments provide effective dates of testing specifications and testing frequencies corresponding to the testing items of the equipment;

step 114: etching process engineers provide testing specifications for the equipment;

step 115: system developers input the testing specifications, the effective dates of the testing specifications and the testing frequencies;

step 116: store the data into the database; and step 117: end.

Figure 6:
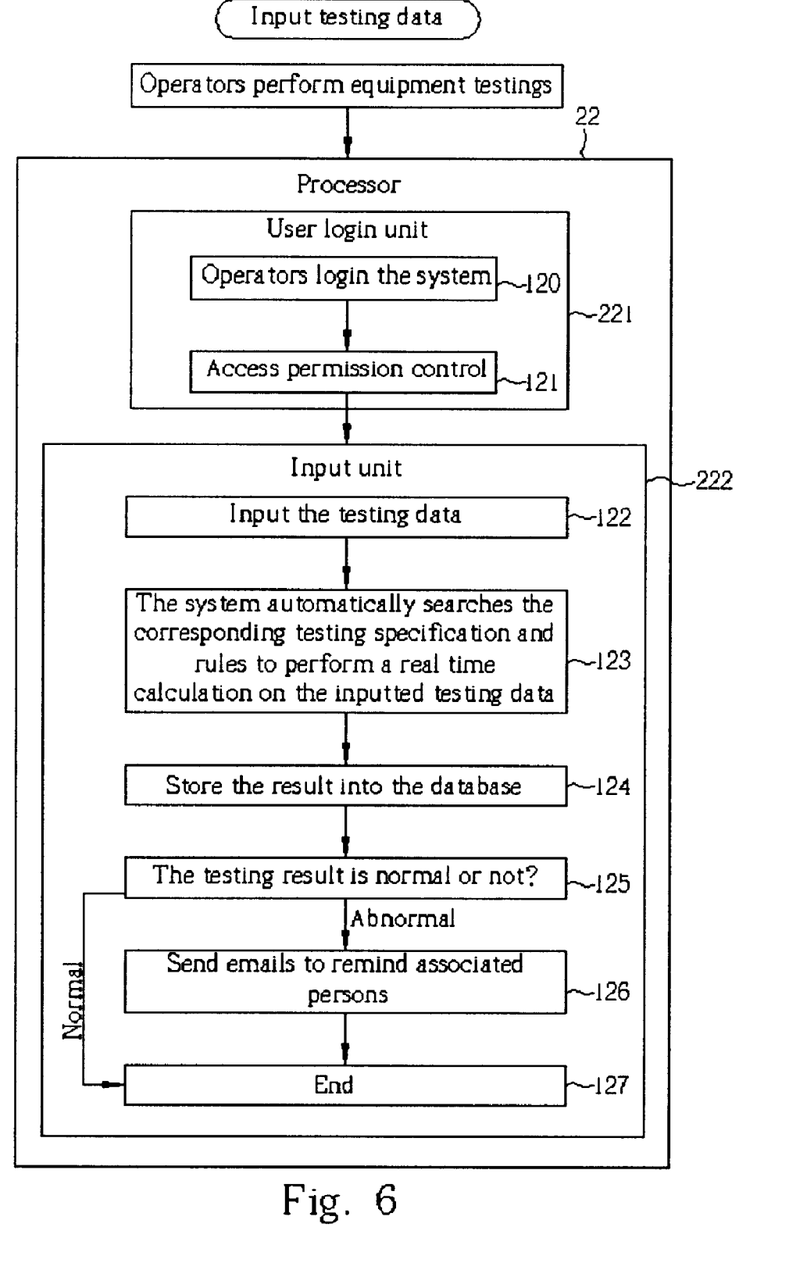
FIG. 6 is a flow chart for a first embodiment of a semiconductor automation system to input testing data according to the present invention.

As shown in FIG. 6, the method for the user 24 to input the testing data in the automation system 2 includes the steps:

step 120: operators use the user login unit 221 to login the system;

step 121: the processor 22 obtains user names and passwords from the operators and controls access permission for the operators;

step 122: operators with the access permission use the input unit 222 to input the testing data in the database;

step 123: the system automatically searches the corresponding testing specification and calculation rules to perform a real time calculation on the inputted testing data and generate a testing result;

step 124: store the testing result into the database;

step 125: check the testing result is normal or not? if the testing result is abnormal, perform the step 126; if the testing result is normal, perform the step 127;

step 126: send emails to remind associated persons by the message server 23; and step 127: end.

Figure 7:
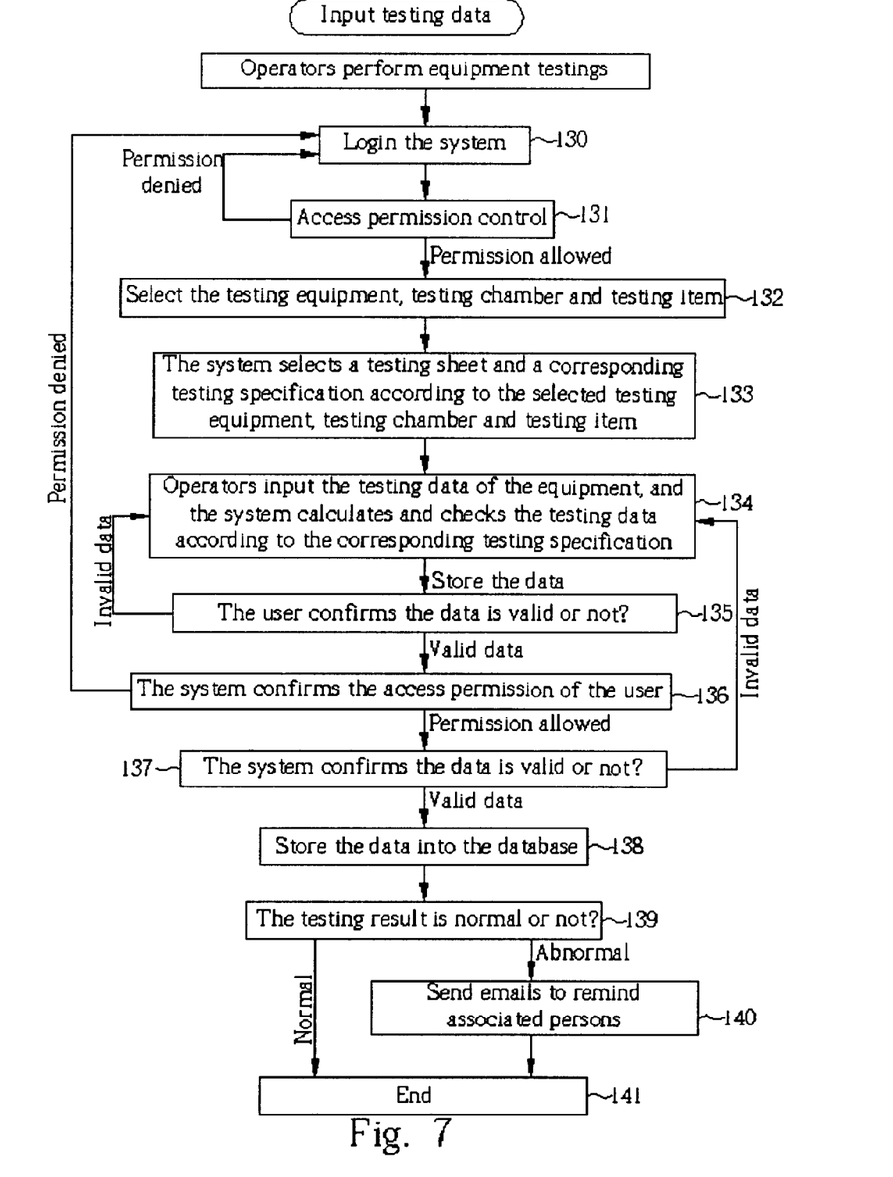
FIG. 7 is a flow chart for a second embodiment of a semiconductor automation system to input testing data according to the present invention.

FIG. 7 shows a flow chart of an alternative embodiment for the automation system 2 to input the testing data in the database. The automation system 2 of this embodiment generates a testing sheet automatically for the operators to input the testing data. As a result, problems such as use of wrong testing sheets as occurred in the prior art method are completely prevented. As shown in FIG. 7, the method for the user 24 to input the testing data in the automation system 2 includes the steps:

step 130: operators perform equipment tests according to schedule and use the user login unit 221 to login the system;

step 131: the processor 22 obtains user names and passwords from the operators and controls access permission for the operators;

step 132: operators with the access permission use the input unit 222 to select the testing equipment, the testing chamber and the testing item from the database;

step 133: the system selects a testing sheet and a corresponding testing specification according to the selected testing equipment, the selected testing chamber and the selected testing item;

step 134: operators use the testing sheet to input the testing data of the equipment, and the system calculates and checks the testing data according to the corresponding testing specification obtained in the step 133 and generate a testing result;

step 135: operators confirm the data is valid or not? if the data is valid, perform the step 136; if the data is invalid, go back to the step 134;

step 136: the system confirms the access permission of the user;

step 137: the system confirms the data is valid or not? if the data is valid, perform the step 138; if the data is invalid, go back to the step 134;

step 138: store the data into the database;

step 139: check the testing result is normal or not? if the testing result is abnormal, perform the step 140; if the testing result is normal, perform the step 141;

step 140: send emails to remind associated persons by the message server 23; and step 141: end.

Figure 8:
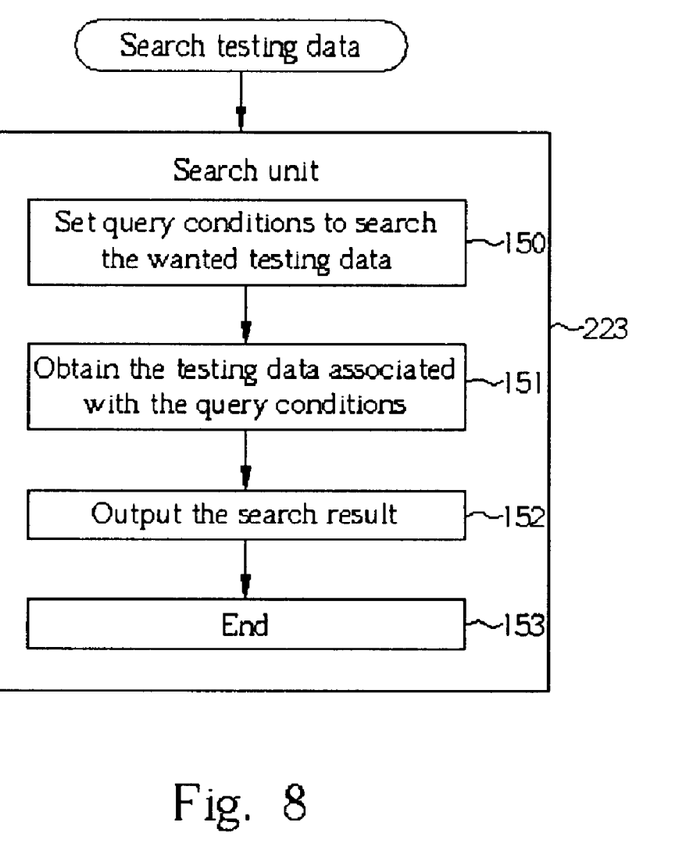
FIG. 8 is a flow chart for a semiconductor automation system to search testing data according to the present invention.

As shown in FIG. 8, the user 24 has to verify his access permission using the user login unit 221 of the processor 22 before he searches the testing data in the automation system 2. Following that, the search unit 223 of the processor 22 is used following the steps:

step 150: set query conditions to search the wanted testing data;

step 151: obtain the testing data associated with the query conditions;

step 152: output the search result; and step 153: end.

Figure 9:
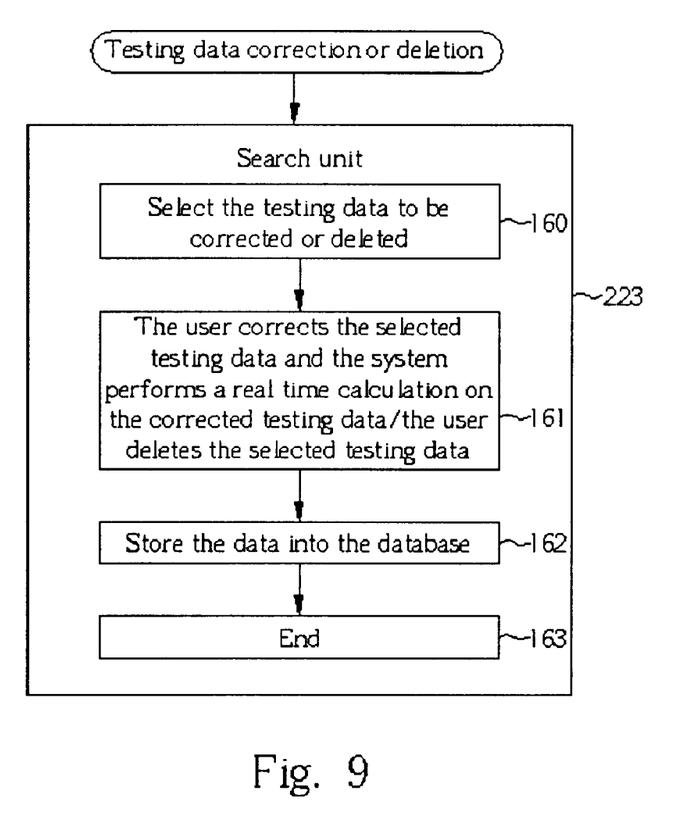
FIG. 9 is a flow chart for a first embodiment of a semiconductor automation system to correct/delete testing data according to the present invention.

As shown in FIG. 9, the user 24 has to verify his access permission using the user login unit 221 of the processor 22 before he corrects the testing data in the automation system 2 or deletes the testing data from the automation system 2.

Following that, the search unit 223 of the processor 22 is used following the steps:

step 160: search the database and select the testing data to be corrected or deleted;

step 161: the user 24 corrects the selected testing data and the system performs a real time calculation on the corrected testing data, or the user deletes the selected testing data;

step 162: store the data into the database; and step 163: end.

Figure 10:
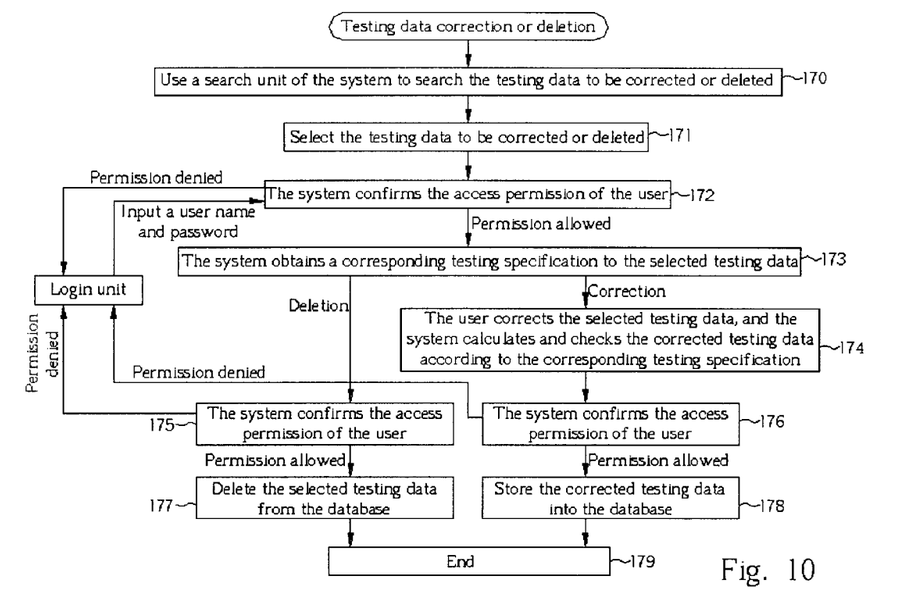
FIG. 10 is a flow chart for a second embodiment of a semiconductor automation system to correct/delete testing data according to the present invention.

FIG. 10 shows a flow chart of an alternative embodiment for the automation system 2 to correct the testing data in the database or delete the testing data from the database. In order to prevent unexpectedly irretrievable changes to the testing data in the database, the user 24 has to confirm whether he has the permission to correct or delete the testing data before the correction or deletion has been done in the system according to this embodiment. As shown in FIG. 10, the method for the user 24 to correct or delete the testing data in the automation system 2 includes the steps:

step 170: set query conditions to search the testing data to be corrected or deleted;

step 171: select the testing data to be corrected or deleted;

step 172: the system confirms the access permission of the user 24;

step 173: the system searches the corresponding testing specifications to the selected testing data; if the user 24 wants to correct the selected testing data, perform the step 174; if the user 24 wants to delete the selected testing data, perform the step 175;

step 174: the user 24 corrects the selected testing data and the system performs a real time calculation on the corrected testing data according to the testing specifications obtained in the step 173, and then go to the step 176;

step 175, 176: the system confirms the access permission of the user 24;

step 177: delete the selected testing data from the database;

step 178: store the corrected testing data into the database; and step 179: end.

Figure 11:
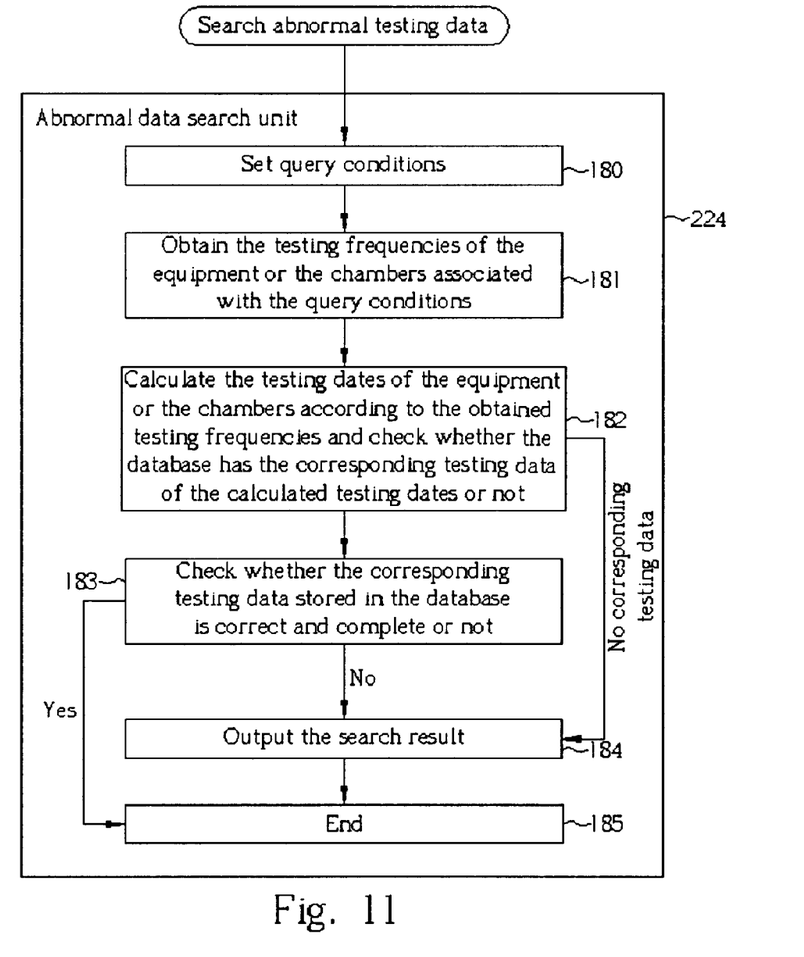
FIG. 11 is a flow chart for a semiconductor automation system to search abnormal testing data according to the present invention.

As shown in FIG. 11, the user 24 has to verify his access permission using the user login unit 221 of the processor 22 before he searches abnormal testing data in the automation system 2. Following that, the abnormal data search unit 224 of the processor 22 is used following the steps:

step 180: set query conditions;

step 181: obtain the testing frequencies of the equipment or the chambers associated with the query conditions;

step 182: calculate the testing dates of the equipment or the chambers according to the obtained testing frequencies and check whether the database has the corresponding testing data of the calculated testing dates or not; if the corresponding testing data is found in the database, perform the step 183; if no corresponding testing data is found in the database, perform the step 184;

step 183: check whether the corresponding testing data stored in the database is correct and complete or not;

step 184: output the search result; and step 185: end.

Figure 12:
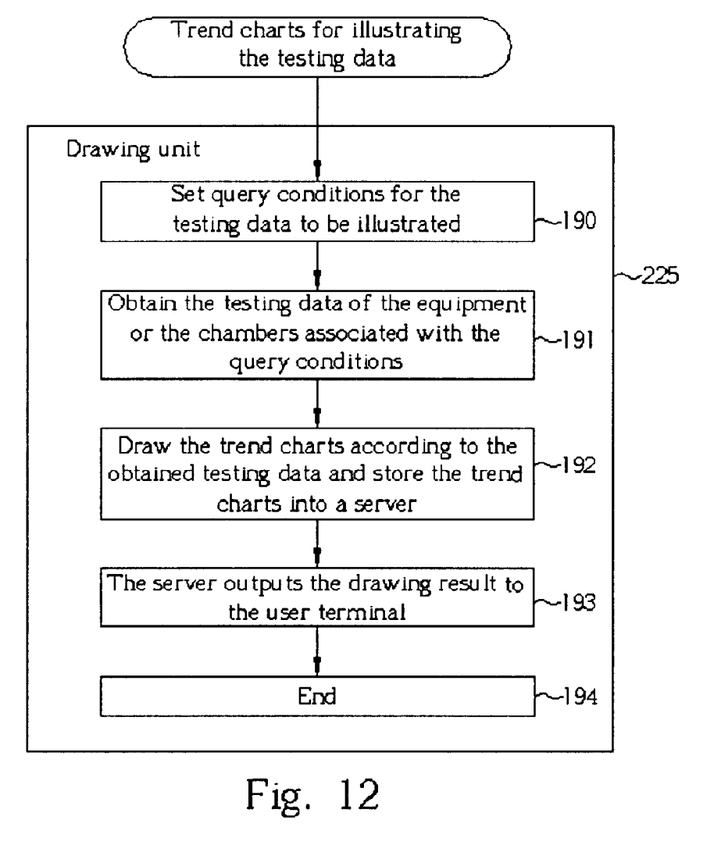
FIG. 12 is a flow chart for a semiconductor automation system to draw trend charts of testing data according to the present invention.

As shown in FIG. 12, the user 24 has to verify his access permission using the user login unit 221 of the processor 22 before he draws trend charts of the testing data using the automation system 2. Following that, the drawing unit 225 of the processor 22 is used following the steps:

step 190: set query conditions for the testing data to be illustrated;

step 191: obtain the testing data of the equipment or the chambers associated with the query conditions;

step 192: draw the trend charts according to the obtained testing data and store the trend charts into a server;

step 193: the server outputs the drawing result to the user terminal; and step 194: end.

Figure 13:
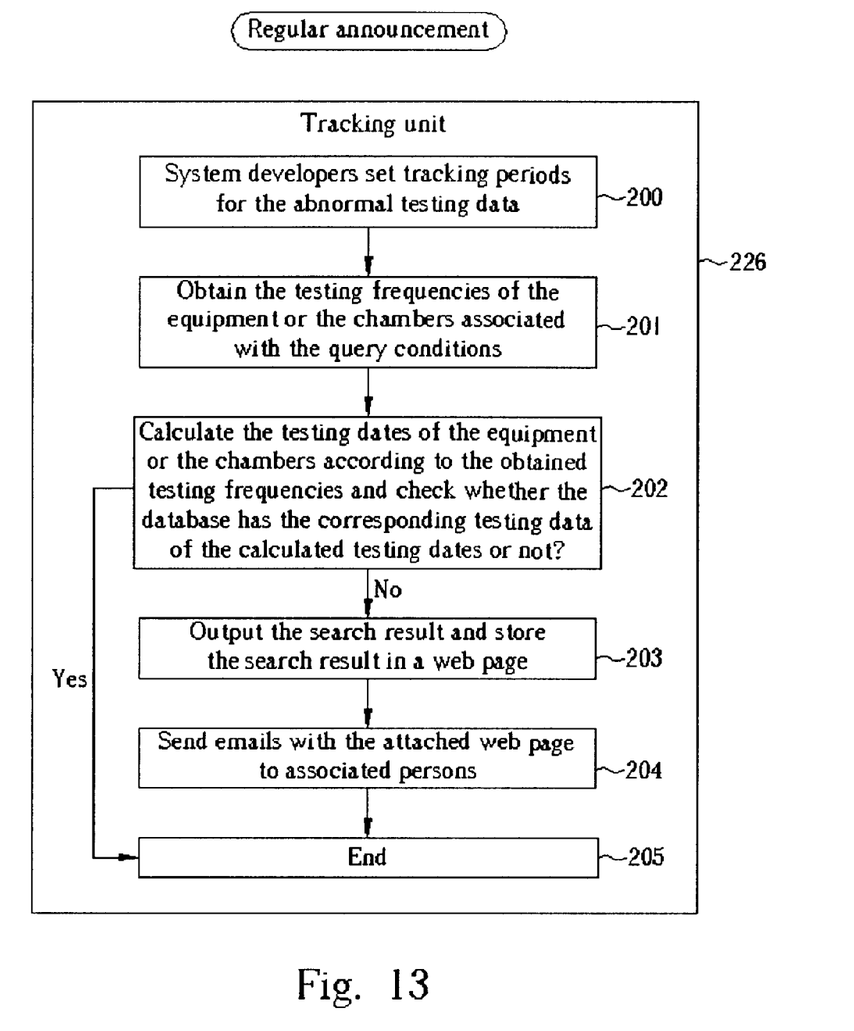
FIG. 13 is a flow chart for a semiconductor automation system to periodically track testing data in a database according to the present invention.

As shown in FIG. 13, the automation system 2 provides periodically tracking to the testing data in the database using the tracking unit 226. The tracking unit 226 of the processor 22 is used following the steps:

step 200: system developers set tracking periods for the abnormal testing data;

step 201: obtain the testing frequencies of the equipment or the chambers associated with the query conditions;

step 202: calculate the testing dates of the equipment or the chambers according to the obtained testing frequencies and check whether the database has the corresponding testing data of the calculated testing dates or not; if the corresponding testing data is found in the database, perform the step 205; if no corresponding testing data is found in the database, go to the step 203;

step 203: output the search result and store the search result in a web page;

step 204: send emails with the attached web page to associated persons; and step 205: end.

The semiconductor automation system of the present invention utilizes the testing specifications and the calculation rules stored in the database to perform the real time calculation and check the testing result. Therefore, the equipment testings are performed more effectively, and human calculation errors are reduced to improve reliability of the equipment testings. In addition, the semiconductor automation system provides event management to send the reminder messages when the testing result is abnormal or when the equipment is found not test according to schedule. As a result, the status of the equipment can be easily controlled to facilitate analysis and improvement of production yields.

In contrast to the prior art, the semiconductor automation system and the method thereof of the present invention provides the advantages of:

(1) preventing manufacturing costs of human calculation errors;

(2) corresponding the information in the system to the manufacturing demands, such as the temporary engineering change notice (TECN);

(3) corresponding plans of the equipment testings to the execution conditions of the equipment testings;

(4) using the IE browser to access the system;

(5) performing calculation on the testing data according to the specific calculation rules stored in the system to prevent calculation errors;

(6) checking the calculation results with the corresponding testing specifications automatically;

(7) storing the testing data completely;

(8) storing the testing data reliably;

(9) searching the testing data easily;

(10) analyzing the testing data easily; and (11) providing real time mail for event management.

Those skilled in the art will readily observe that numerous modifications and alterations of the system and the method may be made while retaining the teachings of the invention. Accordingly, the above disclosure should be construed as limited only by the metes and bounds of the appended claims.

What is claimed is:

1. A semiconductor automation system for a daily check on semiconductor equipments, the semiconductor automation system comprising:

a database for storing data of testing items, testing specifications, and testing frequencies of the semiconductor equipments;

a processor for automatically selecting a testing sheet and a corresponding testing specification from the database to input testing data in the testing sheet, perform real time calculation on the newly added testing data and get a testing result, the processor further comprising a search unit for obtaining specific testing data; a drawing unit for generating a trend chart to illustrate the specific testing data; and a tracking unit for periodically tracking the database to find testing data corresponding to the testing frequencies; and a message server for sending a first message to engineers associated with the daily check when the testing result is abnormal, and sending a second message to engineers when the tracking unit finds no testing data corresponding to the testing frequencies in the database.

2. The semiconductor automation system of claim 1, wherein the semiconductor equipments comprise a new equipment or an existed equipment of performing regular equipment testings.

3. The semiconductor automation system of claim 2, wherein the database comprises a testing item block for a system developer to define and store the testing items of the semiconductor equipments.

4. The semiconductor automation system of claim 2, wherein the database comprises a testing specification block for a process engineer to define and store the testing specifications and testing frequencies according to the corresponding testing items.

5. The semiconductor automation system of claim 1, wherein the database comprises a user information block for storing user names, passwords and corresponding authority of the users.

6. The semiconductor automation system of claim 1, wherein the database comprises a testing data block for storing the testing data of the semiconductor equipments.

7. The semiconductor automation system of claim 1, wherein the processor comprises a user login unit, the user login unit obtaining a user name and a password from a user and determining access priority for the user to use the processor or access the database.

8. The semiconductor automation system of claim 1, wherein the processor comprises an input unit for a user to update data in the database according to his access priority.

9. The semiconductor automation system of claim 1, wherein the processor comprises an abnormal data search unit for a user to set query conditions and obtain the abnormal testing data associated with the query conditions.

10. The semiconductor automation system of claim 1, wherein the semiconductor automation system is a network management system and enables a user to access the network management system through Internet or other networks.

11. The semiconductor automation system of claim 1, wherein the semiconductor equipments comprise etching equipments, photolithographic equipments, ion implantation equipments or thin-film deposition equipments.

12. A semiconductor automation method for a daily check on semiconductor equipments, the method comprising:

defining data of semiconductor equipments in a database to obtain testing items, testing specifications, and testing frequencies of the semiconductor equipments;

using a processor to automatically select a testing sheet and a corresponding testing specification from the database to input testing data in the testing sheet, perform real time calculation on newly added testing data and get a testing result;

using a search unit of the processor to obtain specific testing data;

using a drawing unit of the processor to generate a trend chart to illustrate the specific testing data;

using a tracking unit of the processor to periodically track the database, thus finding testing data corresponding to the testing frequencies; and using a message server to send a first message to engineers associated with the daily check when the testing result is abnormal, and send a second message to engineers when no testing data corresponding to the testing frequencies is found in the database.

13. The method of claim 12, wherein the semiconductor equipments comprise a new equipment.

14. The method of claim 13, wherein a method of defining the testing items, testing specifications, and testing frequencies of the new introduced equipment comprises:

defining and storing the testing items of the new equipment in a testing item block of the database by a system developer; and defining and storing the testing specifications and testing frequencies according to the corresponding testing items in a testing specification block of the database by a process engineer.

15. The method of claim 12, wherein the semiconductor equipments comprise an existed equipment of performing regular equipment testings.

16. The method of claim 15, wherein a method of defining the testing items, testing specifications, and testing frequencies of the existed equipment comprises:

updating and storing the testing items of the existed equipment in a testing item block of the database by a process engineer; and updating and storing the testing specifications and testing frequencies according to the corresponding testing items in a testing specification block of the database by the process engineer or other process engineers.

17. The method of claim 12, wherein the processor generates a testing sheet corresponding to each of the semiconductor equipments by selecting corresponding testing items, testing specifications, and testing frequencies from the database, enabling a user to use the corresponding testing sheet to add the testing data in the database.

18. The method of claim 12, wherein the method further comprises using a user login unit to determine a access priority of a user to use the processor or access the database according to a user name and a password obtained from the user.

19. The method of claim 12, wherein the method further comprises using an input unit to enable a user to update the data in the database according to his access priority.

20. The method of claim 12, wherein the method further comprises using an abnormal data search unit to enable a user to set query conditions and obtain the abnormal testing data associated with the query conditions.

21. The method of claim 12, wherein a user accesses the database, uses the processor or obtains the message through Internet or other networks.

22. The method of claim 12, wherein the semiconductor equipments comprise etching equipments, photolithographic equipments, ion implantation equipments or thin-film deposition equipments.

* * * * *